(12) United States Patent
Figueredo et al.

(10) Patent No.: US 10,141,268 B2
(45) Date of Patent: Nov. 27, 2018

(54) CIRCUIT PACKAGE WITH INTERNAL AND EXTERNAL SHIELDING

(71) Applicant: Avago Technologies General IP (Singapore) Pte. Ltd., Singapore (SG)

(72) Inventors: Domingo Figueredo, Fernandina Beach, FL (US); Husnu Masaracioglu, San Jose, CA (US); Marshall Maple, Cupertino, CA (US); Deog-Soon Choi, Seoul (KR); Ashish Alawani, San Jose, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 140 days.

(21) Appl. No.: 14/927,511

(22) Filed: Oct. 30, 2015

(65) Prior Publication Data

US 2017/0127581 A1     May 4, 2017

(51) Int. Cl.
*H05K 7/00* (2006.01)
*H01L 23/552* (2006.01)
(Continued)

(52) U.S. Cl.
CPC .. *H01L 23/552* (2013.01); *H01L 2224/16225* (2013.01); *H01L 2224/48091* (2013.01); *H01L 2224/48227* (2013.01); *H01L 2224/48233* (2013.01); *H01L 2224/48465* (2013.01); *H01L 2224/49171* (2013.01);
(Continued)

(58) Field of Classification Search
CPC ... H01L 23/28; H01L 2924/161; H01L 23/36; H01L 23/3736; H01L 21/56; H01L 31/0203; H01L 31/048; H01L 23/293; H05K 3/284; H05K 2201/10977; H05K 1/11; H05K 1/162; H05K 1/165; H05K 1/167

USPC ............... 361/751, 760, 762–766, 782, 783; 257/687, 704, 706, 707, 720, 787, 788, 257/793

See application file for complete search history.

(56) References Cited

U.S. PATENT DOCUMENTS

| 7,030,469 | B2 * | 4/2006 | Mahadevan | .......... H01L 21/561 257/659 |
| 7,663,227 | B2 * | 2/2010 | Macris | .................... H01L 23/10 257/706 |

(Continued)

*Primary Examiner* — Binh Tran

(57) ABSTRACT

A module includes a circuit package, which includes first and second electronic components on a substrate, internal and external shields, and a molded compound. The first electronic component includes a first die substrate with first electronic circuitry that generates electromagnetic radiation. The second electronic component includes a second die substrate with second electronic circuitry. The internal shield is electrically connected to ground and substantially covers a surface of the second die substrate facing away from the substrate, the internal shield being configured to shield the second electronic circuitry from the electromagnetic radiation generated by the first electronic circuitry. The molded compound is disposed over the substrate and the first and second electronic components, and the external shield is disposed on at least one outer surface of the circuit package and electrically connected to ground. The external shield is configured to protect the circuit package from external electromagnetic radiation and environmental stress.

20 Claims, 5 Drawing Sheets

(51) Int. Cl.
  *H05K 5/00* (2006.01)
  *H05K 1/18* (2006.01)
  *H05K 3/28* (2006.01)
  *H05K 1/16* (2006.01)
  *H05K 1/11* (2006.01)

(52) U.S. Cl.
  CPC ............... *H01L 2224/73257* (2013.01); *H01L 2224/73259* (2013.01); *H01L 2924/181* (2013.01); *H01L 2924/1815* (2013.01); *H01L 2924/19105* (2013.01); *H05K 1/11* (2013.01); *H05K 1/162* (2013.01); *H05K 1/165* (2013.01); *H05K 3/284* (2013.01)

(56) References Cited

U.S. PATENT DOCUMENTS

| | | |
|---|---|---|
| 8,110,902 B2 | 2/2012 | Eun et al. |
| 2003/0002271 A1 | 1/2003 | Nurminen |
| 2005/0224954 A1* | 10/2005 | Kelly .................... H01L 23/367 257/706 |
| 2010/0006987 A1 | 1/2010 | Murugan et al. |
| 2014/0070395 A1* | 3/2014 | Chen .................... H01L 23/552 257/698 |
| 2015/0001689 A1* | 1/2015 | Goetz .................... H01L 23/552 257/659 |

* cited by examiner

CIRCUIT PACKAGE WITH INTERNAL AND EXTERNAL SHIELDING

BACKGROUND

Small electronic components, including amplifiers, filters, transducers and the like, are employed in a number of devices, particularly in radio frequency (RF) wireless communications, for example. Various types of filters, for example, include acoustic filters, such as surface acoustic wave (SAW) resonator devices containing SAW resonators, and bulk acoustic wave (BAW) resonator devices containing thin film bulk acoustic resonators (FBARs) and solidly mounted resonators (SMRs), for example.

Conventionally, the electronic components are combined in circuit packages and covered with external shields to form discrete shielded packages, referred to as "modules." The external shields, which may be referred to as "global shields," generally cover the top and side walls of the circuit packages, and provide protection against externally generated electromagnetic radiation ("external electromagnetic radiation"), as well as and environmental stresses, such as temperature, humidity, and physical impact, for example (e.g., hermetic sealing). In order to provide protection against the external electromagnetic radiation, the external shields are formed of electrically conductive material, typically metal. The bottoms of the circuit packages are typically shielded by the substrate on or in which the electronic components are provided.

One drawback of the external shield covering the circuit package is that it provides no shielding of individual electronic components from internally generated electromagnetic radiation ("internal electromagnetic radiation") produced by other electronic components within the circuit package, causing electromagnetic interference, such as capacitive and inductive coupling and other cross-talk. Indeed, the external shield aggravates the electromagnetic interference by reflecting the internal electromagnetic radiation back toward the electronic components within the circuit package. Another related drawback of the external shield is that it restricts design freedom required to optimize for best shielding for each of the individual electronic components, device placement within the module and overall module size.

Accordingly, there is a need for enhanced shielding among and between electronic components within a shielded circuit package or module, which does not unduly restrict design freedom with regard to placement of the electronic components, size of the module and other features.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

Figure 1:
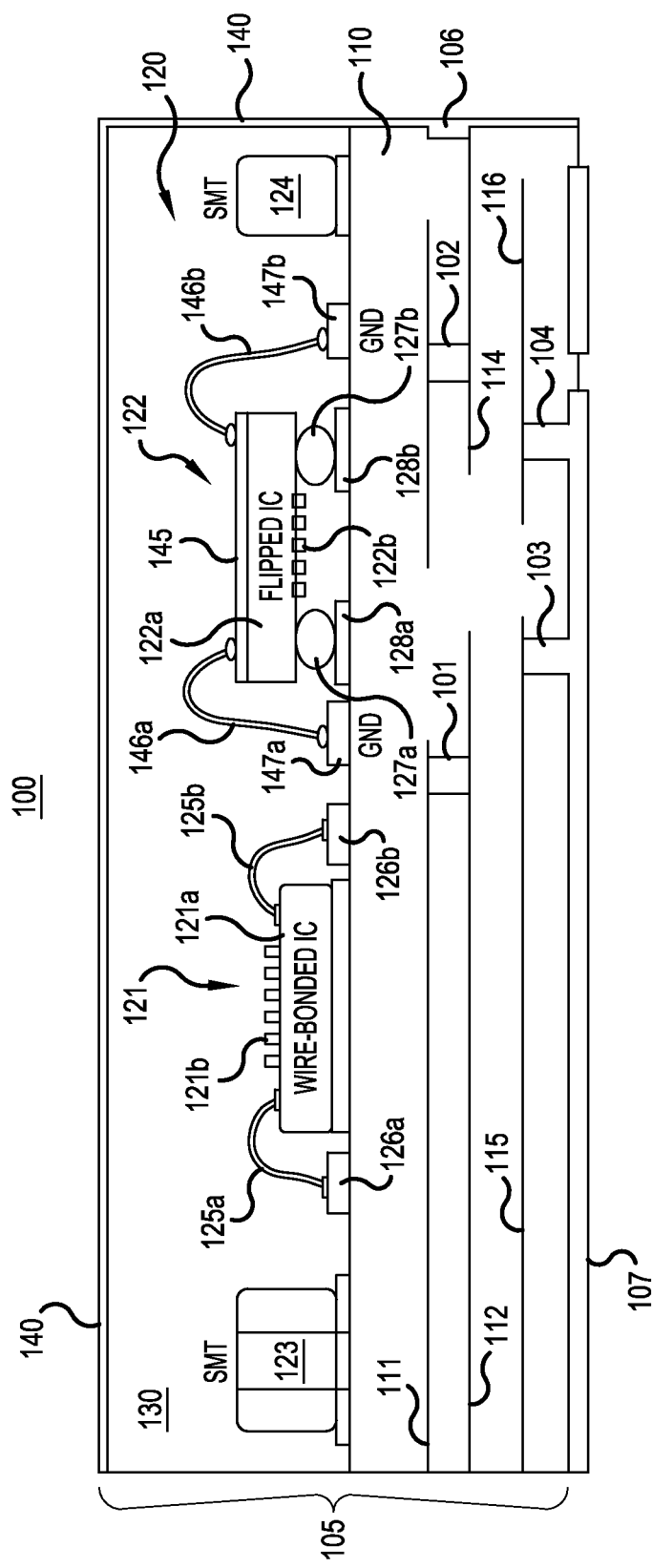
FIG. 1 is a simplified cross-sectional view of a module containing a circuit package, according to a representative embodiment.

In the following detailed description, for purposes of explanation and not limitation, example embodiments disclosing specific details are set forth in order to provide a thorough understanding of the present teachings. However, it will be apparent to one of ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements" relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element. Where a first device is said to be connected or coupled to a second device, this encompasses examples where one or more intermediate devices may be employed to connect the two devices to each other. In contrast, where a first device is said to be directly connected or directly coupled to a second device, this encompasses examples where the two devices are connected together without any intervening devices other than electrical connectors (e.g., wires, bonding materials, etc.).

Generally, in various representative embodiments, a circuit package is included in a module having an external shield disposed on at least one outer surface of the circuit package and electrically connected to ground. The circuit package includes multiple electronic components on a substrate that generate electromagnetic radiation. For example, the circuit package may include a first electronic component on the substrate, the first electronic component including a first die substrate with first electronic circuitry that generates electromagnetic radiation, and a second electronic component on the substrate, the second electronic including a second die substrate with second electronic circuitry. The internal shield comprises a metal layer applied to the surface of the second die substrate facing away from the substrate and electrically connected to ground via at least one bond wire contacting a corresponding at least one ground pad on or in the substrate.

FIG. 1 is a simplified cross-sectional view of a module containing a circuit package, according to a representative embodiment.

Referring to FIG. 1, the module 100 includes a circuit package 105, which includes a substrate 110, multiple electronic components 120 assembled or formed on the substrate 110, and molded compound 130 disposed over the substrate 110 and the electronic components 120. The module 100 further includes an external shield 140 disposed on at least one outer surface of the circuit package 105, and electrically connected to ground, such that the module 100 is a shielded module. The external shield 140 is configured to protect the circuit package 105 (and the electronic components 120 within the circuit package 105) from external electromagnetic radiation, environmental stress, and the like.

The substrate 110 may be formed of any material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics, and the like, for example. The substrate 110 includes embedded circuitry, indicated by representative traces (or layers) 111, 112, 113, 114, 115 and 116, interconnected by representative vias 101, 102, 103 and 104, as well as ground terminal 106, discussed below. In the depicted embodiment, ground plane 107 is provided on a bottom surface of the substrate 110. Of course, alternative arrangements of traces, vias, terminals, ground planes and other electrical circuitry may be included in or on the substrate 110, to provide unique benefits for any particular situation or to meet application specific design requirements of various implementations, without departing from the scope of the present teachings.

In the depicted embodiment, representative electronic components 120 assembled or formed on the substrate 110 include a wire-bonded integrated circuit (IC) 121, a flipped chip IC 122, and surface mounted technology (SMT) components 123 and 124. For purposes of discussion, the wire-bonded IC 121 may be referred to as a first electronic component and is assumed to produce relatively strong electromagnetic radiation, and the flipped chip IC 122 may be referred to as a second electronic component and is assumed to be sensitive to such electromagnetic radiation. Examples of the wire-bonded IC 121 include power amplifiers, RF signal generators, noise generators and other emitting sources, such as bond wires which carry live signals, PCB traces, and the like; examples of the flipped chip IC 122 include acoustic filters, duplexers, diplexers and Low Noise Amplifiers; and examples of SMT components include inductors, capacitors, transistors, diodes, and other integrated circuits. Of course, the number and types of electronic components 120 are not limited, and thus may vary without departing from the scope of the present teachings.

As mentioned above, the molded compound 130 is disposed over the substrate 110 and the electronic components 120 (e.g., the wire-bonded IC 121, the flip chip IC 122, and the SMT components 123 and 124). The molded compound 130 may be formed of a reinforced or non-reinforced epoxy resin, for example, and may be applied using any process compatible with fabrication of semiconductor devices, such as injection molding, transfer molding, or compression molding, or application in liquid form and subsequently cured, for example. The molded compound 130 generally protects the electronic components 120 and provides additional structural support to the module 100. In various embodiments, the molded compound 130 may hermetically seal the electronic components 120 within the circuit package 105.

In the depicted embodiment, the wire-bonded IC 121 includes a first die substrate 121a with first electronic circuitry 121b mounted on and/or at least partially in the first die substrate 121a, generally on the side of the first die substrate 121a facing away from the substrate 110 (e.g., the top surface, as shown in FIG. 1). The first electronic circuitry 121b is electrically connected to ground and/or other electronic circuitry via bond wires 125a and 125b and respective pads 126a and 126b. It is assumed for purposes of illustration that the first electronic circuitry 121b generates electromagnetic radiation, as mentioned above. The flipped chip IC 122 includes a second die substrate 122a with second electronic circuitry 122b mounted on and/or at least partially in the second die substrate 122a, generally on the side of the second die substrate 122a facing toward the substrate 110 (e.g., the bottom surface, as shown in FIG. 1). The second electronic circuitry 122b is electrically connected to ground and/or other electronic circuitry via solder joints 127a and 127b and respective pads 128a and 128b arranged on or in the substrate 110. The other electronic circuitry to which the first and second electronic circuitry 121b and 122b may be electrically connected may include, for example, the traces 111, 112, 113, 114, 115 and 116 interconnected by the vias 101, 102, 103 and 104, as well as the ground plane 107.

As mentioned above, since the first electronic circuitry 121b generates electromagnetic radiation, the second electronic circuitry 122b is subject to electromagnetic interference (e.g., cross-talk), which is typically enhanced by both the first electronic circuitry 121b and the second electronic circuitry 122b being enclosed within the external shield 140. Accordingly, an internal shield 145, which may be referred to as a "local shield," is disposed on the surface of the second die substrate 122a facing away from the substrate 110 (e.g., the top surface, as shown in FIG. 1), substantially covering that surface. For example, the internal shield 145 covers the top surface and may be "self-aligned" to the edges of the second die substrate 122a if the conductive layer forming the internal shield 145 is applied to the surface of the flipped chip IC 122 before singulation of flipped chip IC 122, as discussed below Alternatively, the conductive layer forming the internal shield 145 may be applied after singulation of the flipped chip IC 122 using any process that allows localized application of a conductive layer and covers at least about 90 percent of the area of the top surface, although in a typical configuration, the internal shield 145 would cover the entire area of the top surface. The internal shield 145 is thus configured to shield the second electronic circuitry 122b from the electromagnetic radiation generated by the first electronic circuitry 122b (and other electromagnetic radiation generated within the circuit package 105). As shown, the internal shield 145 is grounded. That is, the internal shield 145 is electrically connected to ground via bond wires 146a and 146b and corresponding ground pads 147a and 147b.

The grounded internal shield 145 may be formed of a layer or film of conductive material (e.g., metal), such as copper (Cu), silver (Ag), gold (Au), or aluminum (Al), for example, and may be applied using any process compatible with fabrication of semiconductor devices, such as sputtering, evaporation, plating or similar film deposition, for example. In an embodiment, as mentioned above, the material forming the internal shield 145 would be applied to a wafer containing the flipped chip IC 122, which would then be separated from the wafer (singulated) and assembled on the substrate 110 in the depicted configuration before application of the molded compound 130. Alternatively, the internal shield 145 may be applied individually to the flipped chip IC 122, e.g., after singulation and assembly of the flipped chip IC 122 on the substrate 110, also mentioned above. The internal shield 145 reduces or eliminates electromagnetic interference to the flipped chip IC 122 that would otherwise result from internal electromagnetic radiation (e.g., generated by the wire-bonded IC 121). As mentioned above, the flipped chip IC 122 may be a sensitive signal "receiver," such as an acoustic resonator filter, or a Low Noise Amplifier (LNA), for example, while the wire-bonded IC 121 may be a strong signal "transmitter," such as a power amplifier or noise generator, for example, which produces electromagnetic radiation that would otherwise interfere with operation of the flipped chip IC 122, absent the internal shield 145.

In various alternative embodiments, the internal shield 145 may be connected to ground via only one bond wire and corresponding ground pad (e.g., bond wire 146a and corresponding ground pad 147a, or bond wire 146b and corresponding ground pad 147b), or may be connected to ground via more than two bond wires and corresponding ground pads, without departing from the scope of the present teachings. The bond wires 146a, 146b and the ground pads 147a, 147b may be formed of conductive metal, compatible with semiconductor processes, such as gold (Au), silver (Ag), or aluminum (Al), for example.

In the depicted embodiment, the external shield 140 is shown deposited on the top outer surface of the circuit package 105 (corresponding to the top surface of the molded compound 130) and a side outer surface of the circuit package 105. The external shield 140 is grounded. For example, in the depicted representative configuration, the external shield 140 is connected to the ground terminal 106 exposed at the side outer surface of the circuit package 105. The ground terminal 106 is connected to the trace (or layer) 114, which is connected to the trace (or layer) 115 (or to the trace (or layer) 116) through an internal via (not shown), and the trace 115 (or 116) is connected to the ground plane 107 through via 103 (or 104). In an embodiment, the external shield 140 is disposed on all of the outer surfaces of the circuit package 105, except for the bottom surface, corresponding to the bottom surface of the substrate 110 and/or the ground plane 107 (which provide similar protection). That is, the external shield 140 may be disposed on the top surface, the front and back surfaces, and the left and right surfaces of the circuit package 105. Of course, the external shield may be disposed on fewer than five surfaces, without departing from the scope of the present teachings.

The grounded external shield 140 is formed of a conductive material (e.g., metal), such as copper (Cu), silver (Ag), gold (Au), or aluminum (Al), for example. The external shield 140 may be a conformal coat, for example, applied to the surfaces of the circuit package 105 through sputtering. In various configurations, the external shield may also include a stainless steel (SUS) finish to improve aesthetics and enhance resistance to oxidation and other contamination. The top portion of the external shield 140 may have a thickness of about 4.0 μm, on average, and the side wall(s) of the external shield 140 may have a minimum thickness of about 1.5 μm, for example, although other thicknesses and combinations of thicknesses may be incorporated without departing from the scope of the present teachings. Generally, the external shield 140 protects the electronic components 120 from external electromagnetic radiation and environmental stress, while the internal shield 145 protects the electronic components 120 from internal electromagnetic radiation, reducing electromagnetic interference and improving overall performance of the module 100.

Figure 2:
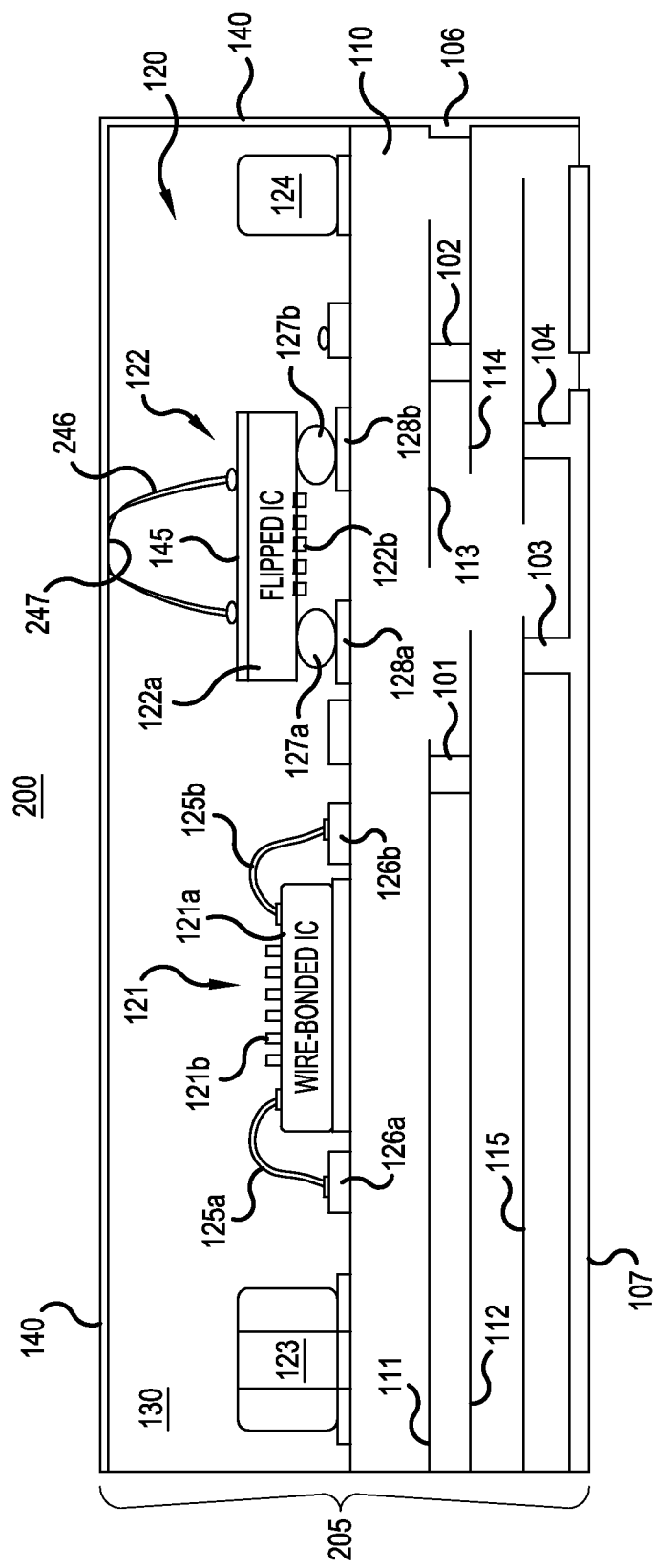
FIG. 2 is a simplified cross-sectional view of a module containing a circuit package, according to a representative embodiment.

FIG. 2 is a simplified cross-sectional view of a module containing a circuit package, according to a representative embodiment.

Referring to FIG. 2, the module 200 includes a circuit package 205, which is substantially similar to the circuit package 105, discussed above, including a substrate 110, multiple electronic components 120 assembled or formed on the substrate 110, and molded compound 130 disposed over the substrate 110 and the electronic components 120. The module 200 further includes an external shield 140 disposed on at least one outer surface of the circuit package 105, and electrically connected to ground. The external shield 140 is configured to protect the circuit package 205 (and the electronic components 120 within the circuit package 205) from external electromagnetic radiation, environmental stress, and the like. Notably, descriptions of the like components (having the same reference numbers) will not be repeated with reference to FIG. 2.

As mentioned above, it is assumed for purposes of illustration that the first electronic circuitry 121b of the wire-bonded IC 121 generates electromagnetic radiation, and that the second electronic circuitry 122b of the flipped chip IC 122 is subject to electromagnetic interference (e.g., crosstalk), which is typically enhanced by both the first electronic circuitry 121b and the second electronic circuitry 122b being enclosed within the external shield 140. Accordingly, internal shield 145 is disposed on the surface of the second die substrate 122a facing away from the substrate 110 (e.g., the top surface, as shown in FIG. 1), substantially covering that surface. The internal shield 145 is thus configured to shield the second electronic circuitry 122b from the electromagnetic radiation generated by the first electronic circuitry 121b (and other electromagnetic radiation generated within the circuit package 105).

As shown, the internal shield 145 is grounded, although not through bond wire connections to pads on the substrate 110, such as bond wires 146a and 146b and corresponding ground pads 147a and 147b as shown in FIG. 1. Rather, the internal shield 145 is electrically connected to the grounded external shield 140 through a top bond wire 246. In the depicted embodiment, both ends of the top bond wire 246 are connected to a surface of the internal shield 145 forming a loop, where an approximate apex 247 of the loop physically and electrically contacts the inside surface of the grounded external shield 140, thereby grounding the internal shield 145. The top bond wire 246 may be formed of conductive metal, compatible with semiconductor processes, such as gold (Au), silver (Ag), or aluminum (Al), for example. The internal shield 145 thus grounded via the top bond wire 246 reduces or eliminates electromagnetic interference to the flipped chip IC 122 that would otherwise result from internal electromagnetic radiation (e.g., generated by the wire-bonded IC 121).

In alternative embodiments, the internal shield 145 may be electrically connected to the external shield 140 via multiple top bond wires in the same manner shown with reference to the top bond wire 246. Also, in alternative embodiments, the top bond wire 246 (and/or any additional bond wires) may not form a complete loop within the finished module 200. This effectively creates two separated top bond wires (not shown), each electrically connected between the top surface of the internal shield 145 and the inside surface of the grounded external shield 140, thereby grounding the internal shield 145. For example, to accommodate this alternative embodiment, the molded compound 130 may be applied at a thickness less than a height of the apex 247, and the portion of the top bond wire 246 extending beyond the top surface of the molded compound 130 may be trimmed away prior to application of the external shield 140, resulting in two separated top bond wires. Similarly, the molded compound 130 may be applied at a thickness greater than or equal to the height of the apex 247, and then the molded compound 130 may be etched and/or planarized down to a thickness less than the height of the apex 247 prior to application of the external shield 140, again resulting in two separated top bond wires. In still another alternative embodiment, a single bond wire with one end electrically connected to the top surface of the internal shield 145 and an opposite end electrically connected to the inside surface of the grounded external shield 140 may be provided. Additional variations of using bond wire(s) to ground the internal shield 145 via the external shield 140 may be incorporated without departing from the scope of the present teachings.

Figure 3:
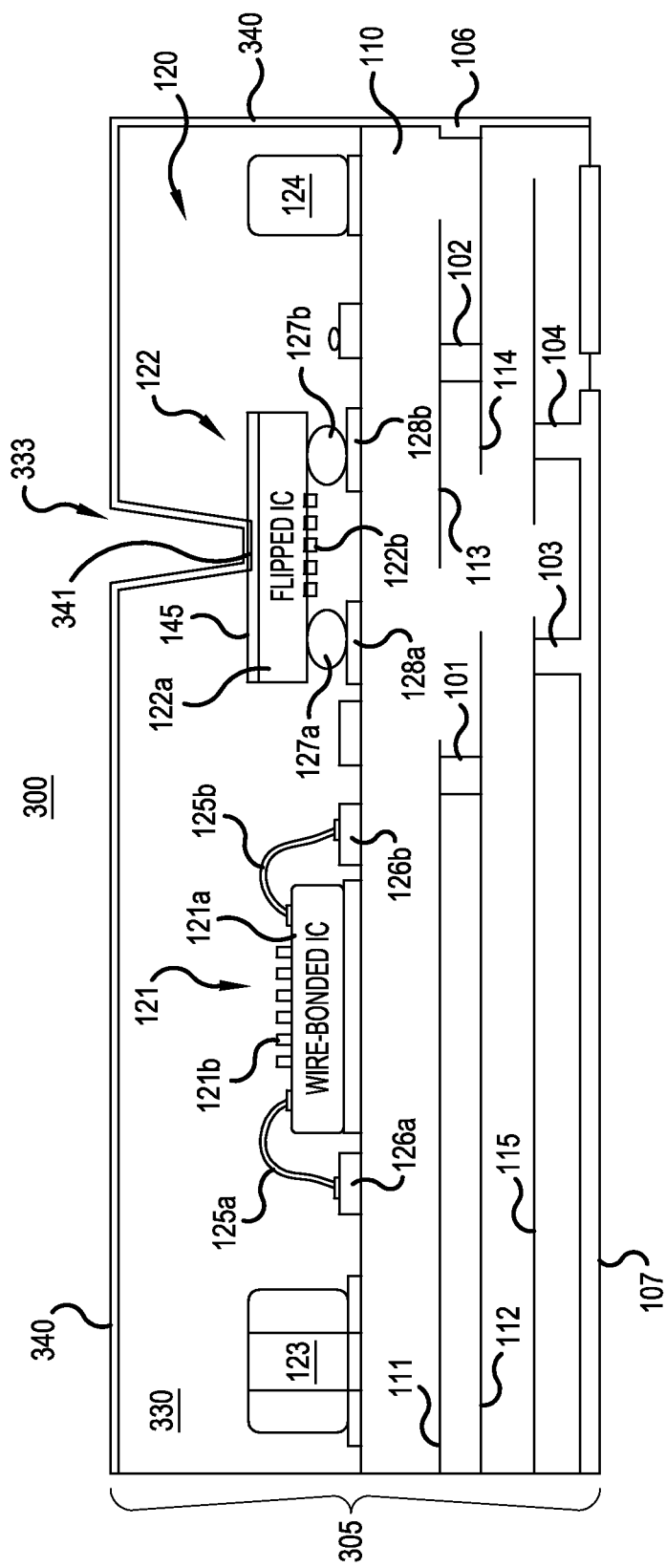
FIG. 3 is a simplified cross-sectional view of a module containing a circuit package, according to a representative embodiment.

FIG. 3 is a simplified cross-sectional view of a module containing a circuit package, according to a representative embodiment.

Referring to FIG. 3, the module 300 includes a circuit package 305, which is substantially similar to the circuit package 105, discussed above, including a substrate 110, multiple electronic components 120 assembled or formed on the substrate 110, and molded compound 330 disposed over the substrate 110 and the electronic components 120. In the depicted embodiment, the molded compound 330 defines a trench 333, discussed below. The module 300 further includes an external shield 340 disposed on at least one outer surface of the circuit package 305, as well as on interior surfaces the trench 333, and electrically connected to ground. The external shield 340 is configured to protect the circuit package 305 (and the electronic components 120 within the circuit package 305) from external electromagnetic radiation, environmental stress, and the like. Notably, descriptions of the like components (having the same reference numbers) will not be repeated with reference to FIG. 3.

As mentioned above, it is assumed for purposes of illustration that the first electronic circuitry 121*b* of the wire-bonded IC 121 generates electromagnetic radiation, and that the second electronic circuitry 122*b* of the flipped chip IC 122 is subject to electromagnetic interference (e.g., cross-talk), which is typically enhanced by both the first electronic circuitry 121*b* and the second electronic circuitry 122*b* being enclosed within the external shield 140. Accordingly, internal shield 145 is disposed on the surface of the second die substrate 122*a* facing away from the substrate 110 (e.g., the top surface, as shown in FIG. 1), substantially covering that surface. The internal shield 145 is thus configured to shield the second electronic circuitry 122*b* from the electromagnetic radiation generated by the first electronic circuitry 121*b* (and other electromagnetic radiation generated within the circuit package 105).

As shown, the internal shield 145 is grounded, although not through bond wire connections to pads on the substrate 110, such as bond wires 146*a* and 146*b* and corresponding ground pads 147*a* and 147*b* as shown in FIG. 1, or through bond wire connections to the external shield 140, such as bond wire 246 as shown in FIG. 2. Rather, the internal shield 145 is electrically connected to the grounded external shield 340 through the trench contact 341 of the external shield 340 that coats and/or fills the inside of the trench 333.

More particularly, in the depicted embodiment, the trench 333 extends from a top surface of the molded compound 330 to the top surface of the internal shield 145. The trench 333 may be formed in the molded compound 330 after the molded compound 330 has been applied over the electronic components 120 and the substrate 110. For example, the trench 333 may be formed by mechanical drilling, laser grooving or chemical etching, or other types of etching, through the applied molded compound 330.

With the trench 330 in place, the external shield 340 is applied, e.g., by sputtering, such that the conductive material or conformal coating of the external shield 340 covers the top surface and side walls of the circuit package 305, as well as the side and bottom interior surfaces of the trench 333. The conductive material covering the bottom interior surface of the trench 333 provides the trench contact 341, which is electrically connected to the internal shield 145, e.g., through direct physical contact. Because the trench contact 341 is part of the external shield 340, which is grounded through the ground terminal 106 exposed at the side outer surface of the circuit package 305, the internal shield 145 is likewise grounded through the ground terminal 106.

In various embodiments, the trench 333 may be partially or entirely filled with conductive material (e.g., the same conductive material of which the external shield 340 is formed), which may be referred to as "filler metal," to enhance the electrical connection between the internal shield 145 and the external shield 340, thereby enhancing the electrical connection between the internal shield 145 and ground. Also, in alternative embodiments, the trench 333 may extend only partially through the molded compound 330, ending short of the internal shield 145. In this case, a bond wire or other electrical conductor (not shown) may be added to span the distance between the trench contact 341 and the internal shield 145, thereby grounding the internal shield 145.

Figure 4A:
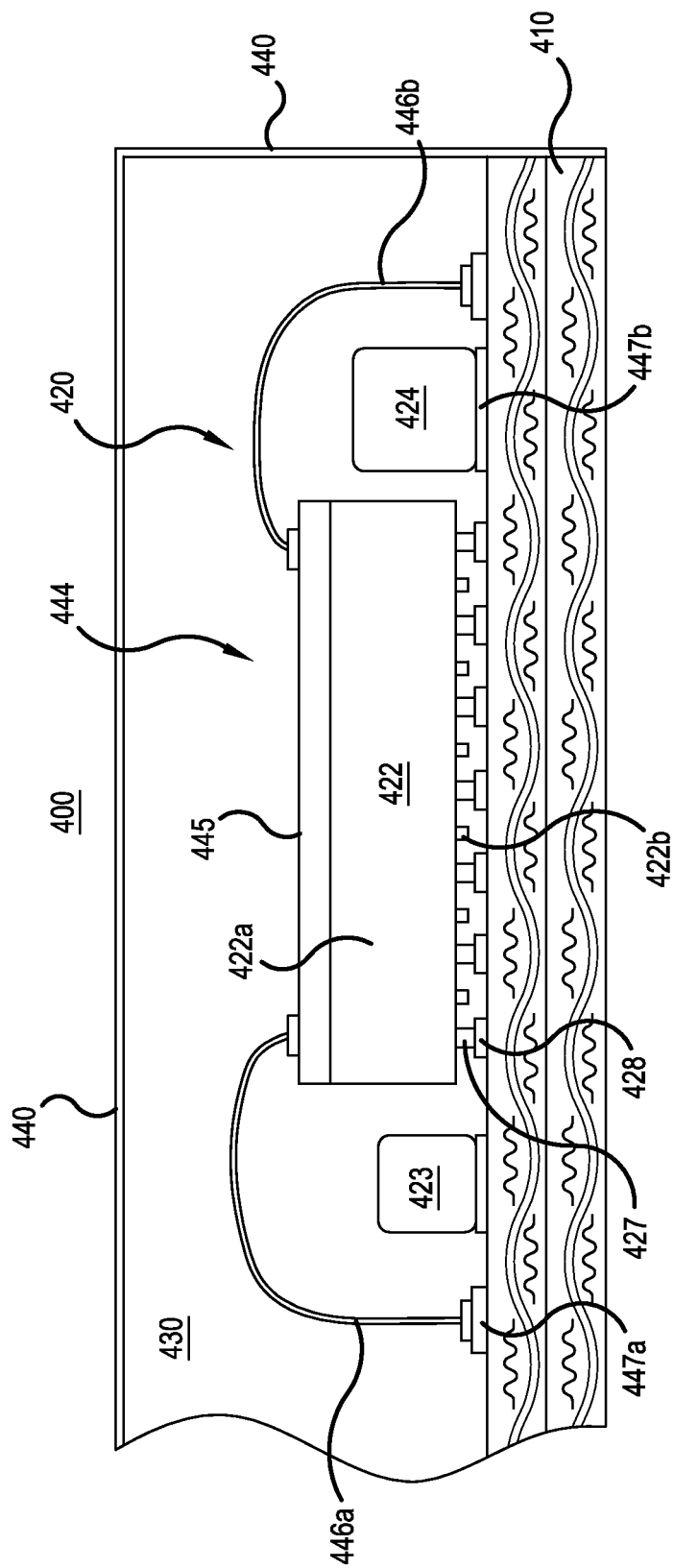
FIG. 4A is a simplified cross-sectional view of a module containing a circuit package, according to a representative embodiment.
Figure 4B:
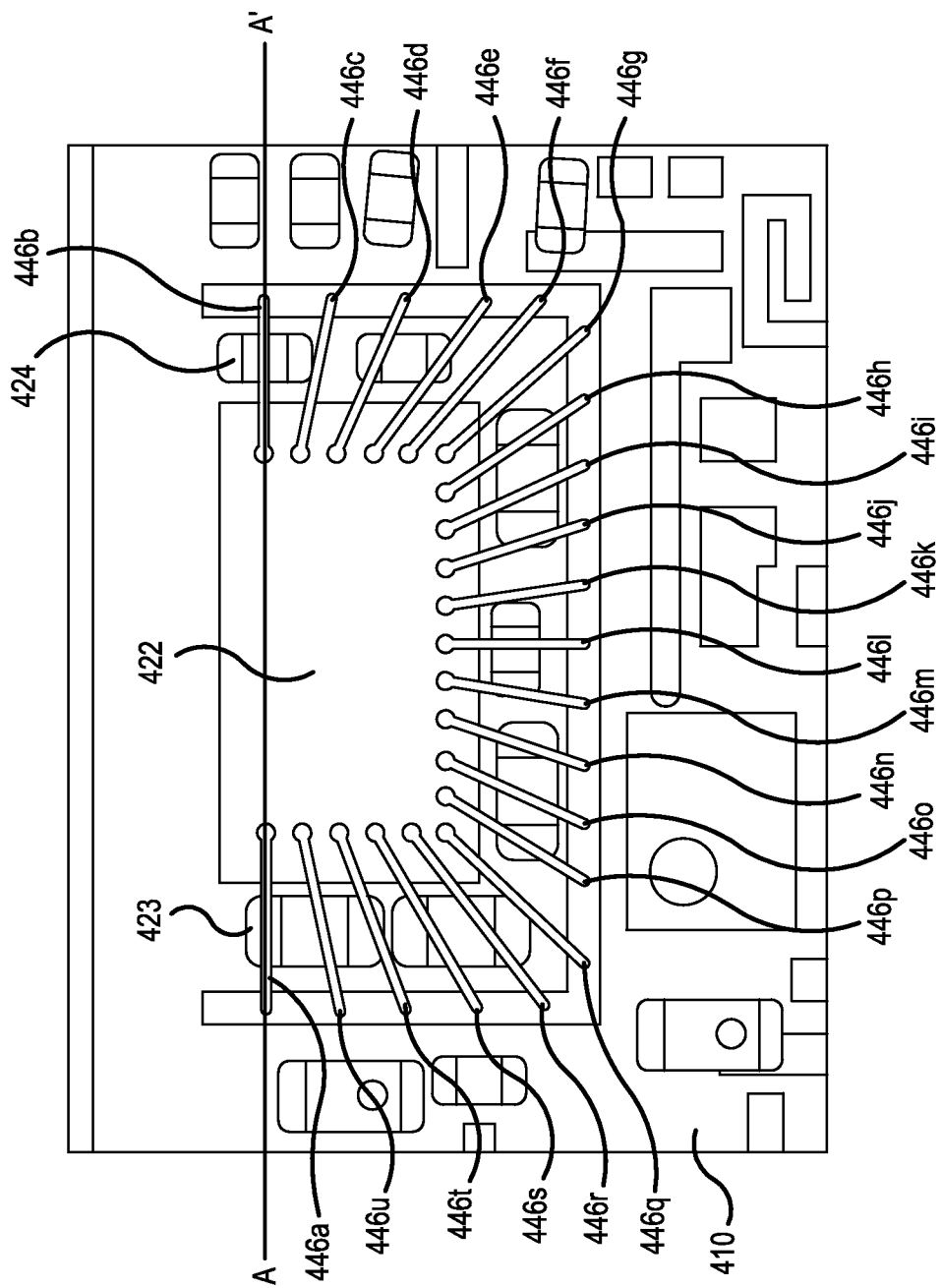
FIG. 4B is a top perspective view of the module of FIG. 4A containing a circuit package, according to a representative embodiment.

FIG. 4A is a simplified cross-sectional view of a module containing a circuit package, according to a representative embodiment, and FIG. 4B is a top perspective view of the module of FIG. 4A containing the circuit package, according to a representative embodiment. The cross-sectional view of FIG. 4A is taken along line A-A' of FIG. 4B, discussed below. Generally, FIGS. 4A and 4B are intended to depict an extended internal shield, which includes a "wire curtain," formed by multiple bond wires connected between a base internal shield on an electronic component and corresponding to multiple ground pads on a substrate.

Referring to FIGS. 4A and 4B, a portion of a module 400 containing a portion of a circuit package 405 is shown. The depicted portion of the circuit package 405 illustratively includes a substrate 410, multiple electronic components 420 assembled or formed on the substrate 410, and molded compound 430 disposed over the substrate 410 and the electronic components 420. The module 400 further includes an external shield 440 disposed on at least one outer surface of the circuit package 405, and electrically connected to ground. The external shield 440 is configured to protect the circuit package 405 (and the electronic components 420 within the circuit package 405) from external electromagnetic radiation, environmental stress, and the like, as discussed above with reference to the external shield 140.

Like the substrate 110, the substrate 410 may be formed of any material compatible with semiconductor processes, such as silicon (Si), gallium arsenide (GaAs), indium phosphide (InP), glass, sapphire, alumina, epoxy, bismaleimide triazine (BT), prepreg composites, reinforced or non-reinforced polymer dielectrics, and the like, for example, and may include embedded circuitry, as discussed above with reference to the substrate 110. For the sake of simplicity, though, the various traces, vias, ground terminals and ground planes are not shown in FIG. 4.

In the depicted embodiment, representative electronic components 420 assembled or formed on the substrate 410 include a flipped chip IC 422 and SMT components 423 and 424. Although not shown, additional electronic components are included on the substrate 410, such as wire-bonded ICs (e.g., wire-bonded IC 121) that generate electromagnetic radiation that cause electromagnetic interference (e.g., cross-talk) with the flipped chip IC 422, and the SMT components 423 and 424. Of course, the number and types of electronic components 420 are not limited, and thus may vary without departing from the scope of the present teachings. The molded compound 430 is disposed over the substrate 410 and the electronic components 420, and may be formed of an epoxy resin, for example. The molded compound 430 may be applied using any process compatible with fabrication of semiconductor devices, as discussed above with reference to the molded compound 130, for example.

In the depicted embodiment, the flipped chip IC 422 includes a die substrate 422a with electronic circuitry 422b mounted on and/or at least partially in the die substrate 422a, generally on the side of the die substrate 422a facing toward the substrate 410 (e.g., the bottom surface, as shown in FIG. 4A). The electronic circuitry 422b is electrically connected to ground and/or other electronic circuitry via solder joints 427 respective pads 428 (only one set of which is labeled in FIG. 4A, for the sake of convenience). The other electronic circuitry to which the electronic circuitry 422b may be electrically connected may include, for example, traces interconnected by vias, as well as a ground plane, as discussed above with reference to FIG. 1.

The circuit package 405 further includes an internal shield 444, which is formed by a base shield 445 and multiple bond wires 446a-446u connected around at least a portion of a periphery of the base shield 445 (as shown in FIG. 4B). The base shield 445 is disposed on the surface of the die substrate 422a facing away from the substrate 410 (e.g., the top surface, as shown in FIG. 4A).

As shown, the base shield 445 is grounded. That is, the base shield 445 is electrically connected to ground via the bond wires 446a-446u, which collectively form a wire curtain extending over the representative SMT components 423 and 424 (as well as other SMT components adjacent the flipped chip IC 422). For example, each of the representative bond wires 446a and 446b has one end connected to a surface of the base shield 445 and an opposite end connected to ground via corresponding ground pads 447a and 447b. The other bond wires 446c-446u are configured in substantially the same manner.

The internal shield 444 (including the base shield 445 and the bond wires 446a-446u) is thus configured to shield the flipped chip IC 422, as well as the SMT components 423 and 424, from the electromagnetic radiation generated by other electronic circuitry within the circuit package 405. The wire curtain, in particular, shields the SMT components 423 and 424 from electromagnetic radiation by the presence of the bond wires 446a-446u. As discussed above with reference to the internal shield 145, the base shield 445 in FIG. 4 may be formed of a film of conductive material (e.g., metal), such as copper (Cu), silver (Ag), gold (Au), or aluminum (Al), for example. The material forming the base shield 445 may be applied to a wafer containing the flipped chip IC 422, which would then be separated from the wafer (singulated) and assembled on the substrate 410 in the depicted configuration before application of the molded compound 430. Alternatively, the base shield 445 may be applied individually to the flipped chip IC 422, e.g., after singulation and assembly of the flipped chip IC 422 on the substrate 410. The internal shield 444 reduces or eliminates electromagnetic interference to the flipped chip IC 422 and the SMT components 423 and 424 that would otherwise result from internal electromagnetic radiation.

In various alternative embodiments, the base shield 445 may be connected to ground via more or fewer bond wires than depicted in the example of FIG. 4. Also, the bond wires may be connected to any number of sides of the base shield, and still provide some degree of electromagnetic shielding of the SMT components over which the bond wires pass. The bond wires 446a-446u and corresponding ground pads may be formed of conductive metal, compatible with semiconductor processes, such as gold (Au), silver (Ag), or aluminum (Al), for example.

In the depicted embodiment, the external shield 440 is shown deposited on the top outer surface of the circuit package 405 (corresponding to the top surface of the molded compound 430) and a side outer surface of the circuit package 405. The external shield 440 may be connected to the ground plane through a ground terminal, exposed at the side outer surface of the circuit package 405, as discussed above with reference to the module 100. Also, the grounded external shield 440 is formed of a conductive material (e.g., metal), such as copper (Cu), silver (Ag), gold (Au), or aluminum (Al), for example, and is otherwise substantially the same as the external shield 140 discussed above.

The various components, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

What is claimed:
1. A module, comprising:
a circuit package, comprising:
a first electronic component on a substrate, the first electronic component comprising a first die substrate with first electronic circuitry that generates electromagnetic radiation internally within the circuit package;
a second electronic component on the substrate, the second electronic component comprising a second die substrate with second electronic circuitry;
an internal shield electrically connected to ground and covering only a surface of the second die substrate facing away from the substrate, the internal shield being configured to shield the second electronic circuitry from the internally generated electromagnetic radiation from the first electronic circuitry; and
a molded compound disposed over the substrate and the first and second electronic components; and
an external shield disposed on at least one outer surface of the circuit package and electrically connected to ground, the external shield being configured to protect the circuit package from external electromagnetic radiation and environmental stress.

2. The module of claim 1, wherein the internal shield comprises a metal layer applied to the surface of the second die substrate facing away from the substrate and electrically connected to ground via at least one bond wire contacting a corresponding at least one ground pad on or in the substrate.

3. The module of claim 1, wherein the internal shield comprises a metal layer applied to the surface of the second die substrate facing away from the substrate and electrically connected to ground via at least one bond wire contacting the external shield.

4. The module of claim 1, wherein the molded compound defines a trench extending from the surface of the internal shield to a top surface of the molded compound, a portion of the external shield being disposed within the trench, and
wherein the internal shield comprises a metal layer applied to the surface of the second die substrate facing away from the substrate and electrically connected to ground via the portion of the external shield disposed within the trench and contacting the metal layer.

5. The module of claim 1, wherein the molded compound defines a trench extending from the internal shield to a top surface of the molded compound, and
wherein the internal shield comprises a metal layer applied to the surface of the second die substrate facing away from the substrate and electrically connected to ground via a filler metal, the filler metal being disposed in at least a portion of the trench and contacting both the metal layer and a portion of the external shield disposed over the trench.

6. The module of claim 1, wherein the second electronic component comprises a flipped chip, such that the second electronic circuitry is on a surface of the second die substrate facing toward the substrate.

7. The module of claim 1, wherein the internal shield comprises one of copper (Cu), silver (Ag), gold (Au), or aluminum (Al).

8. The module of claim 1, wherein the external shield comprises one of copper (Cu), silver (Ag), gold (Au), or aluminum (Al).

9. The module of claim 2, wherein the circuit package further comprises at least one surface mount technology (SMT) component on the substrate, mounted adjacent the second electronic component, and
wherein the at least one bond wire of the internal shield extends from the metal layer applied to the surface of the second die substrate facing away from the substrate, over the at least one SMT component, to provide a wire curtain that enables the internal shield to further shield the at least one SMT component from the internally generated electromagnetic radiation from the first electronic circuitry.

10. A circuit package in a shielded module comprising an external shield disposed on at least one outer surface of the circuit package and electrically connected to ground, the circuit package comprising:
a substrate;
an electronic component assembled or formed on the substrate, the electronic component comprising a die substrate with electronic circuitry on a surface of the die substrate facing toward the substrate;
a internal shield electrically connected to ground, the internal shield being disposed on and covering only a surface of the die substrate facing away from the substrate; and
a molded compound disposed over the substrate and the electronic component,
wherein the external shield is configured to protect the circuit package from external electromagnetic radiation, and the internal shield is configured to protect the electronic circuitry from internal electromagnetic radiation generated within the circuit package by at least one other electronic component assembled or formed on the substrate.

11. The circuit package of claim 10, wherein the internal shield comprises a metal film electrically connected to ground via at least one bond wire contacting a corresponding at least one ground pad on or in the substrate.

12. The circuit package of claim 10, wherein the internal shield comprises a metal film electrically connected to ground via at least one bond wire contacting the external shield.

13. The circuit package of claim 10, wherein the molded compound defines a trench extending from the surface of the internal shield to a top surface of the molded compound, a portion of the external shield being disposed within the trench, and
wherein the internal shield comprises a metal film electrically connected to ground via a trench contact formed by the portion of the external shield disposed within the trench.

14. The circuit package of claim 13, wherein the trench is at least partially filled with a conductive material from which the external shield is formed.

15. The circuit package of claim 10, further comprising:
at least one surface-mount technology (SMT) component on the substrate adjacent the electronic component,
wherein the internal shield comprises a base shield formed of a metal film covering the surface of the die substrate facing away from the substrate and electrically connected to ground via a plurality of bond wires contacting a corresponding plurality of ground pads on or in the substrate, and
wherein the plurality of bond wires extend over the at least one SMT component, creating a wire curtain for protecting the at least one SMT component from the internal electromagnetic radiation generated by the at least one other electronic component.

16. The circuit package of claim 15, wherein the base shield extends to outer edges of the die substrate.

17. The circuit package of claim 16, wherein the plurality of bond wires are connected to the base shield around at least a portion of a periphery of the base shield.

18. The module of claim 1, wherein the internal shield covers more than 90 percent of the surface of the second die substrate facing away from the substrate.

19. The circuit package of claim 10, wherein the internal shield covers more than 90 percent of the surface of the die substrate facing away from the substrate.

20. A module, comprising:
a circuit package, comprising:
an electronic component comprising a die substrate and electronic circuitry on a bottom surface of the die substrate, the bottom surface facing a substrate of the circuit package;
an internal shield electrically connected to ground and substantially covering only a top surface of the die substrate, the top surface being opposite the bottom surface of the die substrate, wherein the internal shield shields the electronic circuitry of the electronic component from internally generated electromagnetic radiation generated by at least one other electronic component within the circuit package; and a molded compound disposed over the substrate, the electronic component, the internal shield, and the at least one other electronic component; and an external shield disposed on at least one outer surface of the circuit package and electrically connected to ground, wherein the external shield shields the circuit package from externally generated electromagnetic radiation generated outside the module.

\* \* \* \* \*